(12) United States Patent
Pillarisetty et al.

(10) Patent No.: US 9,812,574 B2
(45) Date of Patent: Nov. 7, 2017

(54) TECHNIQUES AND CONFIGURATIONS FOR STACKING TRANSISTORS OF AN INTEGRATED CIRCUIT DEVICE

(71) Applicant: INTEL CORPORATION, Santa Clara, CA (US)

(72) Inventors: Ravi Pillarisetty, Potland, OR (US); Charles C. Kuo, Hillsboro, OR (US); Han Wui Then, Portland, OR (US); Gilbert Dewey, Hillsboro, OR (US); Willy Rachmady, Beaverton, OR (US); Van H. Le, Portland, OR (US); Marko Radosavljevic, Beaverton, OR (US); Jack T. Kavalieros, Portland, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/938,739

(22) Filed: Nov. 11, 2015

(65) Prior Publication Data

US 2016/0064545 A1    Mar. 3, 2016

Related U.S. Application Data

(62) Division of application No. 13/997,972, filed as application No. PCT/US2011/067663 on Dec. 28, 2011, now Pat. No. 9,236,476.

(51) Int. Cl.
*H01L 29/78* (2006.01)
*H01L 29/786* (2006.01)
(Continued)

(52) U.S. Cl.
CPC .......... *H01L 29/785* (2013.01); *G11C 11/412* (2013.01); *H01L 21/845* (2013.01);
(Continued)

(58) Field of Classification Search
CPC .............. H01L 29/785; H01L 29/4232; H01L 29/66795; H01L 27/1211; H01L 21/845;
(Continued)

(56) References Cited

U.S. PATENT DOCUMENTS 7,915,713 B2   3/2011   Faul et al.
8,264,021 B2   9/2012   Lai et al.
(Continued)

FOREIGN PATENT DOCUMENTS

CN   201725238 U   1/2011
CN   102034871 A   4/2011

OTHER PUBLICATIONS

International Search Report and Written Opinion dated Aug. 1, 2012 for International Application No. PCT/US2011/067663, 9 pages.
(Continued)

*Primary Examiner* — Fernando L Toledo
*Assistant Examiner* — Adam S Bowen
(74) *Attorney, Agent, or Firm* — Schwabe, Williamson & Wyatt, P.C.

(57) ABSTRACT

Embodiments of the present disclosure provide techniques and configurations for stacking transistors of a memory device. In one embodiment, an apparatus includes a semiconductor substrate, a plurality of fin structures formed on the semiconductor substrate, wherein an individual fin structure of the plurality of fin structures includes a first isolation layer disposed on the semiconductor substrate, a first channel layer disposed on the first isolation layer, a second isolation layer disposed on the first channel layer, and a second channel layer disposed on the second isolation layer, and a gate terminal capacitively coupled with the first channel layer to control flow of electrical current through the first channel layer for a first transistor and capacitively coupled with the second channel layer to control flow of
(Continued)

electrical current through the second channel layer for a second transistor. Other embodiments may be described and/or claimed.

15 Claims, 10 Drawing Sheets

(51) Int. Cl.
    *H01L 21/84*     (2006.01)
    *H01L 29/423*     (2006.01)
    *H01L 27/12*     (2006.01)
    *G11C 11/412*     (2006.01)
    *H01L 29/66*     (2006.01)
    *H01L 27/06*     (2006.01)

(52) U.S. Cl.
    CPC ...... *H01L 27/1211* (2013.01); *H01L 29/4232* (2013.01); *H01L 29/42392* (2013.01); *H01L 29/66795* (2013.01); *H01L 29/78696* (2013.01); *H01L 27/0688* (2013.01)

(58) Field of Classification Search
    CPC ......... H01L 29/42392; H01L 29/78696; H01L 27/0688; G11C 11/412
    USPC ........................................................ 257/365
    See application file for complete search history.

(56) References Cited

U.S. PATENT DOCUMENTS

| 2008/0308880 | A1 | 12/2008 | Inaba |
| 2010/0025826 | A1 | 2/2010 | Faul et al. |
| 2010/0059807 | A1* | 3/2010 | Cho .................. H01L 27/10814 257/306 |
| 2011/0079829 | A1 | 4/2011 | Lai et al. |
| 2011/0193157 | A1 | 8/2011 | Juengling |

OTHER PUBLICATIONS

International Preliminary Report on Patentability dated Jul. 10, 2014 for International Application No. PCT/US2011/067663, 6 pages.
Office Action dated Sep. 24, 2014 for Taiwan Application No. 101145662, 5 pages.
Non-Final Office Action dated Mar. 16, 2015, issued in corresponding U.S. Appl. No. 13/997,972, filed Oct. 21, 2013.
Notice of Allowance dated Sep. 11, 2015, issued in corresponding U.S. Appl. No. 13/997,972, filed Oct. 21, 2013.
Notice of Preliminary Rejection dated Jan. 16, 2017, issued in related Korean Patent Application No. 10-2016-7007077, 10 pages.

\* cited by examiner

TECHNIQUES AND CONFIGURATIONS FOR STACKING TRANSISTORS OF AN INTEGRATED CIRCUIT DEVICE

CROSS REFERENCE TO RELATED APPLICATIONS

The present application is a divisional application of U.S. patent application Ser. No. 13/997,972, filed Oct. 21, 2013 which is a national phase entry under 35 U.S.C. §371 of International Application No. PCT/US2011/067663, filed Dec. 28, 2011, which designated, among the various States, the United States of America, the entire contents of which are hereby incorporated by reference.

FIELD

Embodiments of the present disclosure generally relate to the field of integrated circuits, and more particularly, techniques and configurations for stacking transistors of an integrated circuit device such as a logic and/or memory device.

BACKGROUND

Integrated circuit (IC) devices including, for example, logic and/or memory devices continue to scale to smaller sizes. The shrinking of transistor sizing and/or spacing may increase variation in performance parameters resulting in a degraded VCC-min, which may be a minimum voltage at which an IC device can reliably operate.

BRIEF DESCRIPTION OF THE DRAWINGS

Embodiments will be readily understood by the following detailed description in conjunction with the accompanying drawings. To facilitate this description, like reference numerals designate like structural elements.

Embodiments are illustrated by way of example and not by way of limitation in the figures of the accompanying drawings.

DETAILED DESCRIPTION

Figure 1:
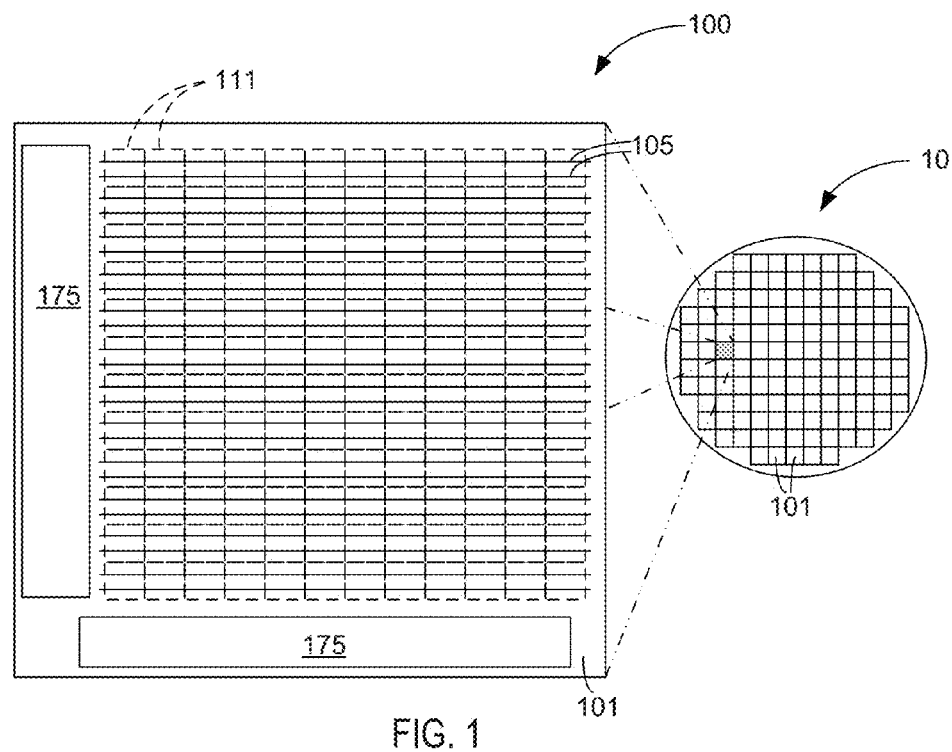
FIG. 1 schematically illustrates a top view of an integrated circuit (IC) device in die form and wafer form, in accordance with some embodiments.

Embodiments of the present disclosure provide techniques and configurations for stacking transistors of an integrated circuit (IC) device. In some embodiments, the techniques and configurations described herein allow scaling of a size of the IC device to smaller dimensions without degradation to performance (e.g., without degradation to VCC-min, which may be a minimum voltage at which the IC device can reliably operate). In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

According to various embodiments, the present disclosure describes an apparatus including a semiconductor substrate, a plurality of fin structures formed on the semiconductor substrate, wherein an individual fin structure of the plurality of fin structures includes a first isolation layer disposed on the semiconductor substrate, a first channel layer disposed on the first isolation layer, a second isolation layer disposed on the first channel layer, and a second channel layer disposed on the second isolation layer. The apparatus may further include a gate terminal capacitively coupled with the first channel layer to control flow of electrical current through the first channel layer for a first transistor and capacitively coupled with the second channel layer to control flow of electrical current through the second channel layer for a second transistor.

In some embodiments, the individual fin structure further includes a one-channel region where the individual fin structure only includes the first channel layer and a second channel region where the individual fin structure includes both the first channel layer and the second channel layer.

In some embodiments, the apparatus may further include a first contact electrically coupled with the first channel layer in the one-channel region, a second contact electrically coupled with the second channel layer in the two-channel region, and a common contact electrically coupled with the first channel layer and the second channel layer in the two-channel region. In some embodiments, the gate terminal is disposed between the first contact and the common contact to control the flow of electrical current between the first contact and the common contact and the gate terminal is disposed between the second contact and the common contact to control the flow of electrical current between the second contact and the common contact.

In some embodiments, the first transistor and the second transistor share the common contact and the first transistor and the second transistor form an inverter. In some embodiments, the first transistor is a pull-up or pull-down transistor of an integrated circuit device and the second transistor is a pull-up or pull-down transistor of the integrated circuit device. In some embodiments, the first transistor is a pull-down transistor and the second transistor is a pull-up transistor.

In some embodiments, the integrated circuit device is a memory device. The apparatus may further include a wordline gate terminal capacitively coupled with the first channel layer in the one-channel region to control flow of electrical current through the first channel layer for a third transistor and a bitline contact electrically coupled with the first channel layer in the one-channel region.

In some embodiments, the third transistor is a pass-gate transistor of the memory device that shares the common contact with the first transistor and the second transistor. In some embodiments, the memory device is a static random access memory (SRAM) device.

In some embodiments, the gate terminal and the wordline gate terminal are disposed in a first layer of interlayer dielectric material (ILD) and the first contact, the second contact, the common contact, and the bitline contact are disposed in a second layer of ILD material that is disposed on the first layer of ILD material and the gate terminal.

In some embodiments, the gate terminal, the first contact, the second contact, and the third contact comprise at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

The apparatus may further include a gate dielectric film disposed between the gate terminal and each of the first channel layer and the second channel layer, the gate dielectric film comprising at least one of silicon oxide ($SiO_2$), silicon oxynitride ($SiO_xN_y$), silicon nitride ($Si_xN_y$), aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements.

In some embodiments, the gate terminal is configured to surround, in at least one planar dimension, material of the first channel layer and material of the second channel layer, the first contact is configured to surround, in at least one planar dimension, material of the first channel layer, the second contact is configured to surround, in at least one planar dimension, material of the second channel layer, and the common contact is configured to surround, in at least one planar dimension, material of the first channel layer and material of the second channel layer.

In some embodiments, the first channel layer and the second channel layer have a rounded profile in at least one dimension. In some embodiments, a width of a portion of the individual fin structure that is adjacent to the semiconductor substrate is greater than a width of a portion of the individual fin structure that is distal to the semiconductor substrate. In some embodiments, the first channel layer has a width in a direction that is perpendicular to an elongate direction of the individual fin structure, the width of the first channel layer being greater than a width of the second channel layer, the width of the second channel layer being perpendicular to the elongate direction of the individual fin structure.

In some embodiments, the gate terminal is configured in a tri-gate configuration around the second channel layer and configured in a dual-gate configuration around the first channel layer, the first contact is configured in a tri-gate configuration around the first channel layer, the second contact is configured in a tri-gate configuration around the second channel layer and the common contact is configured in a tri-gate configuration around the second channel layer and configured in a dual-gate configuration around the first channel layer. In some embodiments, the first contact, the second contact, and the common contact have a profile that is more tapered relative to a profile of the gate terminal. In some embodiments, the first channel layer comprises a group IV, III-V, or II-VI semiconductor material, the second channel layer comprises a group IV, III-V, or II-VI semiconductor material, the first isolation layer comprises silicon oxide ($SiO_2$) and/or a group IV, III-V, or II-VI semiconductor material, and the second isolation layer comprises $SiO_2$ and/or a group IV, III-V, or II-VI semiconductor material.

In some embodiments, the first channel layer and the second channel layer comprise a nanowire material. In some embodiments, the first channel layer comprises gallium arsenide (GaAs), the second channel layer comprises germanium (Ge), and the semiconductor substrate comprises silicon (Si). In some embodiments, the first channel layer comprises an N-type material; and the second channel layer comprises a P-type material. In some embodiments, the first channel layer has a layer thickness that is greater than a layer thickness of the second channel layer.

In some embodiments, the first isolation layer comprises aluminum arsenide (AlAs) and silicon oxide ($SiO_2$) and the second isolation layer comprises $SiO_2$. In some embodiments, the first channel layer is epitaxially coupled with the first isolation layer, the second isolation layer is epitaxially coupled with the first channel layer and the second channel layer is epitaxially coupled with the second isolation layer.

In some embodiments, a buffer layer epitaxially coupled with the semiconductor substrate, wherein the first isolation layer is epitaxially coupled with the buffer layer. In some embodiments, one or more of the first isolation layer, the first channel layer, the second isolation layer, and the second isolation layer is composed of multiple films or layers.

In some embodiments, the semiconductor substrate is part of a singulated die of a wafer. In some embodiments, the individual fin structure and another individual fin structure of the plurality of fin structures extend in parallel across at least one common unit cell of a memory device and extend across multiple unit cells of the memory device.

In some embodiments, the common contact and the gate terminal are a first common contact and a first gate terminal disposed in the at least one common unit cell of the memory device. The apparatus may further include a second gate terminal and a second common contact disposed in the at least one common unit cell, the second gate terminal and the second common contact being disposed on the another individual fin structure, wherein the second gate terminal is electrically coupled with the first common contact and the second common contact is electrically coupled with the first gate terminal.

According to various embodiments, the present disclosure describes a method including providing a semiconductor substrate, depositing a first isolation layer on the semiconductor substrate, a first channel layer on the first isolation layer, a second isolation layer on the first channel layer, and a second channel layer on the second isolation layer to form a stack of layers, patterning the stack of layers to form one or more fin structures, the one or more fin structures including the first isolation layer, the first channel layer, the second isolation layer, and the second channel layer and removing material of the second isolation layer and the second channel layer to form one-channel regions and two-channel regions in an individual fin structure of the one or more fin structures, the one-channel regions being portions of the individual fin structure that only include the first channel layer and the two-channel regions being portions of the individual fin structure that include both the first channel layer and the second channel layer.

In some embodiments, depositing the first isolation layer on the semiconductor substrate, the first channel layer on the first isolation layer, the second isolation layer on the first channel layer, and the second channel layer on the second isolation layer is performed by molecular beam epitaxy (MBE), atomic layer epitaxy (ALE), epitaxial growth, chemical beam epitaxy (CBE), metal-organic chemical vapor deposition (MOCVD), or combinations thereof.

In some embodiments, patterning the stack of layers and removing material of the second isolation layer is performed using a patterning process including lithography and etch processes.

The method may further include forming a gate terminal, the gate terminal being capacitively coupled with the first channel layer to control flow of electrical current through the first channel layer for a first transistor and being capacitively coupled with the second channel layer to control flow of electrical current through the second channel layer for a second transistor, the gate terminal being disposed between the first contact and the common contact to control the flow of electrical current between the first contact and the common contact for the first transistor and the gate terminal being disposed between the second contact and the common contact to control the flow of electrical current between the second contact and the common contact for the second transistor.

In some embodiments, forming the gate terminal comprises selectively removing material of the first isolation layer and the second isolation layer in the two-channel regions and depositing an electrically conductive material to fill an area between the first channel layer and the second channel layer. In some embodiments, the electrically conductive material is deposited by atomic layer deposition (ALD).

The method may further include forming a first contact, a second contact, and a common contact, wherein the first contact is electrically coupled with the first channel layer in the one-channel region, the second contact is electrically coupled with the second channel layer in the two-channel region, and the common contact is electrically coupled with the first channel layer and the second channel layer in the two-channel region.

In some embodiments, forming a first contact, a second contact, and a common contact is performed using three independent patterning processes that correspond to formation of each of the first contact, the second contact, and the common contact.

The method may further include depositing a first layer of interlayer dielectric (ILD) material, wherein the gate terminal is disposed in the first layer of ILD material and depositing a second layer of ILD material on the first layer of ILD material, wherein the first contact, the second contact, and the common contact are formed in the second layer of ILD material. In some embodiments, forming the gate terminal comprises a replacement metal gate process that utilizes a sacrificial gate material. In some embodiments, forming the first contact, the second contact, and the common contact comprises a patterning process that does not use a sacrificial contact material, wherein the first contact, the second contact, and the common contact have a profile that is more tapered relative to a profile of the gate terminal.

In some embodiments, the method include selectively replacing material of the deposited first and second isolation layers with a different material in the two-channel regions prior to removing material of the second isolation layer and the second channel layer. In some embodiments, the material of the deposited first and second isolation layers comprises a group III-V semiconductor material and the different material comprises silicon oxide ($SiO_2$).

In some embodiments, the method includes depositing a buffer film on the semiconductor substrate, the buffer film being disposed between the semiconductor substrate and the first isolation layer. In some embodiments, providing the semiconductor substrate comprises providing a wafer.

According to various embodiments, the present disclosure describes a computing device or system including a motherboard, a communication chip mounted on the motherboard, and a processor or a memory device mounted on the motherboard, the processor or the memory device including a semiconductor substrate, a plurality of fin structures formed on the semiconductor substrate, wherein an individual fin structure of the plurality of fin structures includes a first isolation layer disposed on the semiconductor substrate, a first channel layer disposed on the first isolation layer, a second isolation layer disposed on the first channel layer, and a second channel layer disposed on the second isolation layer; and a gate terminal capacitively coupled with the first channel layer to control flow of electrical current through the first channel layer for a first transistor and capacitively coupled with the second channel layer to control flow of electrical current through the second channel layer for a second transistor.

In some embodiments, the individual fin structure further includes a one-channel region where the individual fin structure only includes the first channel layer and a second channel region where the individual fin structure includes both the first channel layer and the second channel layer. The computing device or system may further include a first contact electrically coupled with the first channel layer in the one-channel region, a second contact electrically coupled with the second channel layer in the two-channel region, and a common contact electrically coupled with the first channel layer and the second channel layer in the two-channel region. In some embodiments, the computing device or system is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. Other embodiments may be described and/or claimed.

FIG. 1 schematically illustrates a top view of an IC device 100 in die form and wafer form, in accordance with some embodiments. In some embodiments, the IC device 100 may be one of a plurality of IC devices formed on a wafer 10 composed of semiconductor material. The wafer 10 may include one or more dies (hereinafter "dies 101") formed on a surface of the wafer 10. Each of the dies 101 may be a repeating unit of a semiconductor product that includes the IC device 100. After a fabrication process of the semiconductor product is complete, the wafer 10 may undergo a singulation process in which each of the dies 101 is separated from one another to provide discrete "chips" of the semiconductor product. The wafer 10 may include a variety of sizes. In some embodiments, the wafer 10 has a diameter ranging from about 25.4 mm to about 450 mm. The wafer 10 may include other sizes and/or other shapes in other embodiments.

According to various embodiments, the IC device 100 may be in wafer 10 form (e.g., not singulated) or die form (e.g., singulated). In some embodiments, the IC device 100 may correspond with or be part of a die of the dies 101. In FIG. 1, one of the dies 101 (shaded in wafer 10) including the IC device 100 is depicted in an exploded view. The IC device 100 may include one or more transistors (e.g., transistors 130, 132, 134 of FIG. 3) configured in a repeating array of unit cells 111, as can be seen. The transistors of the unit cells 111 may include, for example, storage elements (e.g., cells) arranged in pages, sectors, blocks, lines, or other configurations.

The one or more transistors of the unit cells 111 may store information of the IC device 100 or facilitate access to, e.g., read and/or write information to the storage elements. According to various embodiments, the one or more transistors may be formed in a stacked three-dimensional (3D) configuration using one or more fin structures (hereinafter "fin structures 105") as described herein. In some embodiments, the fin structures 105 may extend across multiple unit cells 111 of a row or column of unit cells 111, as depicted. In some embodiments, two fin structures of the fin structures 105 are common to unit cells 111 arranged in a row or column. The fin structures 105 may extend across multiple unit cells 111.

The IC device 100 may include additional components and/or elements. For example, in a case where the IC device 100 is a memory device, the IC device 100 may further include select/decode modules 175 to facilitate access transactions (e.g., read/write operations) performed on the storage elements of the memory device. In some embodiments, the IC device 100 can include memory and/or logic devices combined on a single die. For example, a memory device may be formed on a same die 101 as a processor (e.g., processor 1004 of FIG. 16) or other logic that is configured to store information in the memory device or execute instructions of the memory device. For example, the IC device 100 may include a processor and cache formed on the same die in some embodiments. Stacked transistor configurations described herein may be incorporated in logic or memory, or combinations thereof.

In some embodiments, the IC device 100 may be a volatile memory device such as a random access memory (RAM). In one embodiment, the IC device 100 may be a static RAM (SRAM) device. However, subject matter of the present disclosure is not limited in this regard and techniques and configurations described herein may be implemented in other types of memory devices and/or integrated circuit (IC) devices that benefit from the principles described herein in other embodiments. For example, in some embodiments, the IC device 100 may be a processor or other module that uses an inverter as described herein.

The particular configuration of the IC device 100 of FIG. 1 is one example and other configurations may fall within the scope of the present disclosure. For example, the select/decode modules 175 may be positioned in a variety of other suitable configurations relative to the fin structures 105 or may not be included at all and/or the fin structures 105 may extend in other directions in other embodiments.

Figure 2:
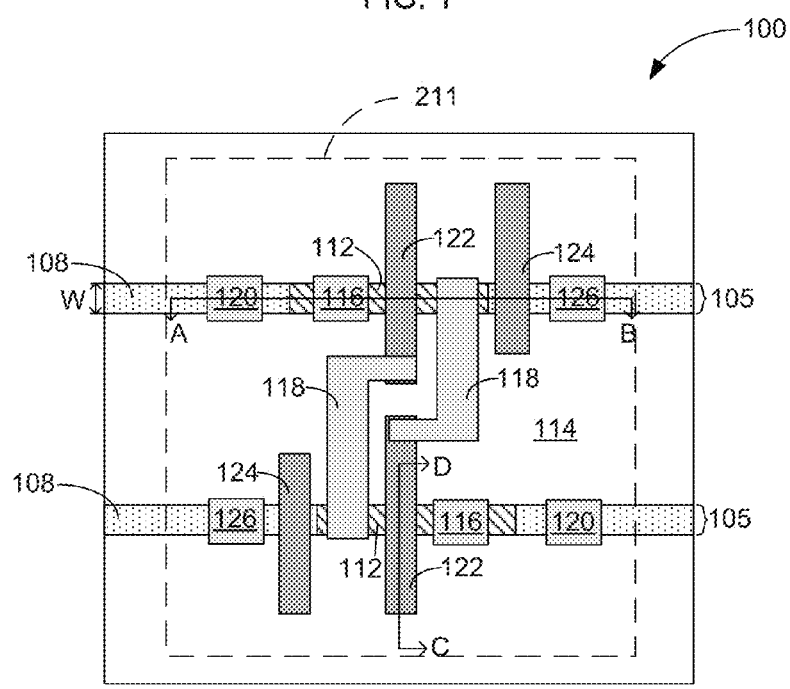
FIG. 2 schematically illustrates a top view of a unit cell layout of an IC device, in accordance with some embodiments.

FIG. 2 schematically illustrates a top view of a unit cell layout 211 of an IC device 100, in accordance with some embodiments. The unit cell layout 211 may represent a layout of a single unit cell of the unit cells 111 of FIG. 1 in some embodiments. The unit cell layout 211 may repeat multiple times in a design of the IC device 100.

Figure 3:
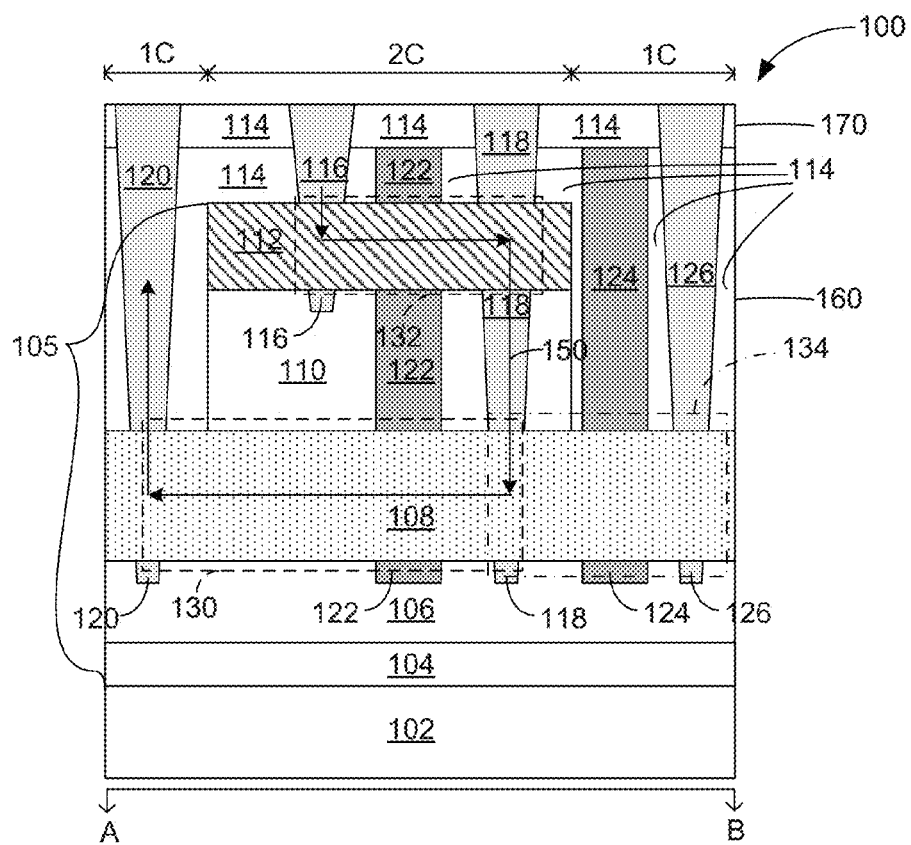
FIG. 3 schematically illustrates a cross-section side view along a fin structure of the IC device, in accordance with some embodiments.

According to various embodiments, the unit cell layout 211 includes fin structures 105 formed on a semiconductor substrate (e.g., semiconductor substrate 102 of FIG. 3). The fin structures 105 may include electrically conductive channel layers isolated from one another by electrically insulative isolation layers. For example, the fin structures 105 may each include a first channel layer 108 and a second channel layer 112 formed on the first channel layer 108. Transistors (e.g., first transistor 130, second transistor 132, and third transistor 134 of FIG. 3) may be formed in a stacked three-dimensional (3D) configuration using the first channel layer 108 and the second channel layer 112. As further described herein, a second channel layer contact (hereinafter "second contact 116"), a first and second channel layer contact (hereinafter "common contact 118"), a first channel layer contact (hereinafter "first contact 120"), a first and second channel layer gate terminal (hereinafter "gate 122") may be coupled to the first channel layer 108 and/or second channel layer 112 to route electrical current in the IC device 100.

In embodiments where the IC device 100 is a memory device, the IC device 100 may further include a wordline gate 124, and a bitline contact 126, coupled as shown. In some embodiments, each of the first contact 120, the second contact 116, the common contact 118, the bitline contact 126, the gate 122, and the wordline gate 124 may have a width that is greater than a width, W, of the fin structures 105, as can be seen. The contacts 116, 118, 120, 126 and the gates 122, 124 may wrap around the fin structures 105 in some embodiments.

In some embodiments, the gate 122 of one of the fin structures 105 may be cross-coupled (e.g., electrically coupled) with a common contact 118 of an adjacent fin structure of the fin structures 105, as can be seen, to provide an inverter latch for the unit cell layout 211 to store information in the IC device 100. The common contact 118 may have an L-shaped profile from the top view to facilitate such coupling, but is not limited to in this regard, and may include other suitable shapes for coupling in other embodiments. According to various embodiments, two of the fin structures 105 extend across the unit cell layout 211 in parallel, as can be seen. The two fin structures may extend across multiple unit cells (e.g., unit cells 111 of FIG. 1) in some embodiments. Thus, transistors (e.g., 130, 132, 134 of FIG. 3) of multiple unit cells may be formed on a same fin structure of the fin structures 105. In other embodiments, the unit cell layout 211 may include more or fewer fin structures 105 than depicted.

An electrically insulative material such as interlayer dielectric (ILD) material 114 may be deposited and/or otherwise formed to isolate components of the IC device 100. In the depicted top view of FIG. 2, ILD material 114 that may cover portions of the fin structures 105 is not shown to avoid obscuring underlying features. Although not shown, the unit cell layout 211 may further include additional electrically conductive structures to facilitate routing of electrical current in the IC device 100. Additional description of the IC device 100 along line AB is provided in FIG. 3 and additional description of the IC device 100 along line CD is provided in FIG. 4.

FIG. 3 schematically illustrates a cross-section side view along a fin structure of the IC device 100, in accordance with some embodiments. For example, the cross-section side view may represent a view along line AB of FIG. 2. Each of the fin structures 105 may include at least two channel layers electrically insulated from one another by an isolation layer (e.g., first channel layer 108, a second isolation layer 110, and second channel layer 112). In some embodiments, each of the fin structures 105 may further include a first isolation layer 106, buffer layer 104, and/or a portion of the semiconductor substrate 102.

According to various embodiments, the IC device 100 is formed on a semiconductor substrate 102 (e.g., wafer 10 of FIG. 1). The semiconductor substrate 102 may include N-type or P-type (100) off-oriented silicon, the crystalline directions of the semiconductor substrate 102 being symbolized by the convention (xyz), where x, y, and z represent respective crystallographic planes in three dimensions that are perpendicular to one another. The semiconductor substrate 102 may, for example, include material of a (100) direction off-cut in a range between about 2 degrees to about 8 degrees towards a (110) direction. Other off-cut orientations or a semiconductor substrate 102 without an off-cut orientation may be used. Off-cutting may eliminate antiphase boundaries. The semiconductor substrate 102 may have a high resistivity between about 1 Ω-cm to about 50 kΩ-cm.

The semiconductor substrate 102 may be a crystalline substrate formed using a bulk silicon or a silicon-on-insulator substructure. In other implementations, the semiconductor substrate 102 may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the semiconductor substrate 102 may be formed are described here, any material that may serve as a foundation upon which a semiconductor device may be built falls within the spirit and scope of the present invention. The semiconductor substrate 102 may include other materials in other embodiments. In some embodiments, the semiconductor substrate 102 is part of a singulated die (e.g., dies 101 of FIG. 1) of a wafer (e.g., wafer 10 of FIG. 1).

In some embodiments, one or more buffer layers (e.g., hereinafter "buffer layer 104") may be formed on the semiconductor substrate 102. The buffer layer 104 may, for example, fill terraces of the semiconductor substrate 102 with atomic bi-layers of a semiconductor material including, for example, one or more group III-V semiconductor materials and/or one or more group II-VI semiconductor materials, or combinations thereof. In some embodiments, the buffer layer 104 may provide a virtual polar semiconductor substrate 102. The buffer layer 104 may further serve as a buffer against dislocation threading and/or provide control of a lattice mismatch (e.g., stress relaxation) between the semiconductor substrate 102 and other layers (e.g., first isolation layer 106). The buffer layer 104 may include N-type or P-type material systems. In an embodiment, the buffer layer 104 includes gallium arsenide (GaAs). In an embodiment, the buffer layer 104 is deposited by an epitaxial deposition process. An epitaxial deposition process may include, for example, molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A stack of layers (e.g., stack of layers 700 of FIG. 7) may be formed on the semiconductor substrate 102 to form transistors (e.g., first transistor 130, second transistor 132, and/or third transistor 134) of the IC device 100. For example, a first isolation layer 106 may be disposed on the semiconductor substrate 102, a first channel layer 108 may be disposed on the first isolation layer 106, a second isolation layer 110 may be disposed on the first channel layer 108, and a second channel layer 112 may be disposed on the second isolation layer 110. The first isolation layer 106, the first channel layer 108, the second isolation layer 110, and the second channel layer 112 may be formed by an epitaxial deposition process. In some embodiments, the layers 106, 108, 110, and 112 are in direct contact (e.g., epitaxially coupled), as depicted. The first isolation layer 106 may be in direct contact with the semiconductor substrate 102 in embodiments where a buffer layer 104 is not used.

The first channel layer 108 may provide a channel for a first transistor 130 and the second channel layer 112 may provide a channel for a second transistor 132. In embodiments where the IC device 100 is a memory device, the first channel layer 108 may further provide a channel for a third transistor 134. Locations of the first transistor 130, the second transistor 132, and the third transistor 134 are approximately indicated using dashes.

The first transistor 130 may be formed by the first contact 120, the common contact 118 and a channel region of the first channel layer 108 disposed between the first contact 120 and the common contact 118. Gate 122 is coupled to the channel region of first channel layer 108 of the first transistor 130 to control current flow through the first transistor 130.

The second transistor 132 may be formed by the second contact 116, the common contact 118, and a channel region of the second channel layer 112 disposed between the second contact 116 and the common contact 118. Gate 122 is coupled to the channel region of the second channel layer 112 of the second transistor 132 to control current flow through the second transistor 132.

The third transistor 134 may be formed by the common contact 118, the bitline contact 126, and a channel region of the first channel layer 108 disposed between the common contact 118 and the bitline contact 126. Wordline gate 124 is coupled to the channel region of the first layer 108 of the third transistor 134 to control current flow through the third transistor 134.

The first transistor 130 and the second transistor 132 may together form an inverter of the IC device 100. The common contact 118 may be a shared contact of the first transistor 130 and the second transistor 132. In some embodiments, the first transistor 130 may be a pull-down transistor of the IC device 100 and the second transistor 132 may be a pull-up transistor of the IC device 100. In other embodiments, the first transistor 130 may be a pull-up transistor of the IC device 100 and the second transistor 132 may be a pull-down transistor of the IC device 100. A path of current flow through the inverter (e.g., the first transistor 130 and the second transistor 132) of the IC device 100 may be represented by a series of arrows 150 according to some embodiments. In other embodiments, the current flow may be in a direction opposite to the direction indicated by arrows 150. That is, the contacts 116, 118, 120 may function as a source terminal (e.g., supplier of electrons) or drain terminal (e.g., receiver of electrons), according to various embodiments.

The first channel layer 108 and the second channel layer 112 may include a variety of suitable materials including N-type and/or P-type material systems. In some embodiments, the first channel layer 108 and the second channel layer 112 are composed of different material systems. For example, when N-type material is used for the first channel layer 108, P-type material may be used for the second channel layer 112 or vice versa. According to various embodiments, the first channel layer 108 and the second channel layer 112 may each have a thickness ranging from 1 nanometer (nm) to 500 nm. In some embodiments, the layer (e.g., first channel layer 108 or second channel layer 112) using N-type material may be thicker (e.g., layer thickness) than the layer using P-type material to provide greater current in the IC device 100. The first channel layer 108 and the second channel layer 112 may have other thicknesses in other embodiments.

In some embodiments, the second channel layer 112 includes a P-type material and the first channel layer 108 includes an N-type material. The second contact 116 may provide a positive supply voltage (e.g., Vdd or Vcc) of the inverter and the first contact 120 may provide a negative supply voltage (e.g., Vss or GND) of the inverter in such a case. In such embodiments, the first transistor 130 may be a pull-down transistor and the second transistor 132 may be a pull-up transistor of the IC device 100 and current may flow from the second contact 116 through the second channel layer 112 to common contact 118, through the common contact 118 to the first channel layer 108, through the first channel layer to the first contact 120. In other embodiments, the second channel layer 112 includes an N-type material and the first channel layer 108 includes a P-type material. The second contact 116 may provide a negative supply voltage (e.g., Vss or GND) and the first contact 120 may provide a positive supply voltage (e.g., Vdd or Vcc) of the inverter and the current may flow in a direction opposite to the direction indicated by arrows 150.

In embodiments where the IC device 100 is a memory device, the IC device 100 may further include a third transistor 134 that shares the common contact 118 with the first and second transistors 130, 132, as can be seen. The third transistor 134 may serve as a pass gate transistor to facilitate access transactions such as read or write operations of the memory device. The third transistor 134 may be a P-type or N-type device according to the type of material selected for the first channel layer 108 in some embodiments.

In some embodiments, the first and second channel layers 108, 112 may include a semiconductor material such as, for example, a group IV, group III-V or group II-VI semiconductor material. The material of the first and second channel layers 108, 112 may include a nanowire material. The material of the first and second channel layers 108, 112 may be selected based on a variety of factors including lattice matching between layers 104, 106, 108, 110, 112 for embodiments where the layers 104, 106, 108, 110, 112 are epitaxially coupled, etch selectivity for forming wrap around contacts (e.g., contacts 116, 118, 120, 126) and/or gates (e.g., gates 122, 124), and channel conductivity. In some embodiments, the materials for the first and/or second channel layers 108, 112 may include material systems including gallium (Ga), arsenic (As), Indium (In), antimony (Sb), germanium (Ge), silicon (Si), and the like, or combinations thereof. For example, the first and/or second channel layers 108, 112 may include germanium (Ge), silicon germanium (SiGe), indium antimonide (InSb), gallium antimonide (GaSb), indium gallium antimonide (InGaSb), gallium arsenide (GaAs), indium gallium arsenide (InGaAs), the like, or combinations thereof. In one embodiment, the first channel layer 108 is formed using a group III-V semiconductor material such as gallium arsenide (GaAs) nanowire material and the second channel layer 112 is formed using germanium (Ge) nanowire material. The material of the first and/or second channel layers 108, 112 may have a smaller band gap than material of the first and/or second isolation layers 106, 110. Other suitable channel materials may be used in other embodiments.

The first isolation layer 106 and the second isolation layer 110 may provide an electrically insulative barrier for the first channel layer 108 and the second channel layer 112. According to various embodiments, the first and second isolation layers 106, 110 include an electrically insulative material relative to the material of the first and second channel layers 108, 112. The material deposited to form the isolation layers 106, 110 may include, for example, group IV, group III-V, or group II-VI semiconductor materials and/or other electrically insulative materials such as silicon oxide ($SiO_2$) and the like. For example, in some embodiments, the material of the first and/or second isolation layers 106, 110 may include $SiO_2$, aluminum (Al), arsenic (As), gallium (Ga), antimony (Sb), Indium (In), and/or combinations thereof. In embodiments where Ge, SiGe, or GaAs is used for the channel (e.g., first and/or second channel layers 108, 112), aluminum arsenide (AlAs) or aluminum gallium arsenide (AlGaAs) may be used for isolation (e.g., first and/or second isolation layers 106, 110). In embodiments where InSb, InGaSb, or GaSb are used for the channel, indium aluminum antimonide (InAlSb) may be used for the isolation. In embodiments where InGaAs is used for the channel, indium aluminum arsenide (InAlAs) may be used for the isolation. Other or additional material may be used in other embodiments.

The material for the isolation layers 106, 110 may be selected based on lattice-matching to adjacent layers, electrical isolation properties, and/or etch selectivity for an etching process that forms the contacts 116, 118, 120, 126 and/or gates 122, 124. For example, a material may be selected that allows etching of the material of the isolation layers 106, 110, but not the channel layers 108, 112. For example, in one embodiment, AlAs is selected for the isolation layers 106, 110 when GaAs and/or Ge nanowire materials are used for the channel layers 108, 112.

According to various embodiments, the isolation layers 106, 110 are initially formed using a lattice-matching material to provide an epitaxial stack of layers (e.g., 104, 106, 108, 110, 112) in the fin structures 105. Portions of the isolation layers 106, 110 using the lattice-matched material may be replaced with other materials that may increase isolation between channel layers 108, 112 or provide greater etch selectivity for etch processes that may be used to remove the material of the isolation layers 106, 110. For example, the IC device 100 may be formed by epitaxially depositing the first isolation layer 106 composed of AlAs, the first channel layer 108 composed of GaAs, the second isolation layer 110 composed of AlAs, and the second channel layer 112 composed of Ge. The fin structures 105 may be formed to have a one-channel layer region (e.g., underlying lines 1C), hereinafter "one-channel region," where the fin structures 105 include only a first channel layer 108 and not the second channel layer 112 and a two-channel layer region (e.g., underlying line 2C in FIG. 3), hereinafter "two-channel region," where the fin structures 105 include both the first channel layer 108 and the second channel layer 112. The fin structures 105 may extend across multiple unit cells (e.g., unit cells 111) and may, thus, include multiple one-channel regions and multiple two-channel regions (e.g., within each unit cell layout 211 of FIG. 2). According to various embodiments, the AlAs of the second isolation layer 110 and/or the first isolation layer 106 may be replaced with $SiO_2$ in the two-channel regions of the fin structures 105 underlying the second channel layer 112 (e.g., underlying line 2C). In such embodiment, the fin structures 105 of a final product (e.g., ready for shipping to a customer) of the IC device 100 may include a first isolation layer 106 that is composed of $SiO_2$ in the two-channel regions under line 2C and AlAs in the one-channel regions under lines 1C. The fin structures 105 may further include a second isolation layer 110 composed of $SiO_2$. Subject matter is not limited in this regard and the first and/or second isolation layers 106, 110 may each be composed of a single material (e.g., only $SiO_2$ or a only a group III-V semiconductor such as AlAs) in other embodiments.

The first isolation layer 106 and the second isolation layer 110 may each have a thickness ranging from 1 nm to 100 nm in some embodiments. The first isolation layer 106 and/or the second isolation layer 110 may include other materials and/or other thicknesses in other embodiments.

In some embodiments, the layers 104, 106, 108, 110, 112 may each be composed of multiple layers or films (not shown). For example, the isolation layers 106, 108 or the channel layers 108, 112 may each have a first material layer deposited that provides lattice-matching such that the first material can be epitaxially deposited on an underlying layer, a second material layer that provides greater channel/isolation performance than the first material layer, and/or a third material layer that provides lattice-matching such that material of another layer may be epitaxially deposited on the third material layer. The components material layers of the layers 104, 106, 108, 110, 112 may be selected for other characteristics such as, for example, etch selectivity in some embodiments. More or fewer material layers than described can be used in each of the layers 104, 106, 108, 110, 112 in other embodiments.

The contacts 116, 118, 120, 126 may be coupled in direct electrical contact with the corresponding first and/or second channel layers 108, 112 (e.g., no intervening dielectric material between the material of the contacts and the channel layers). The gates 122, 124 may be capacitively coupled with the first and/or second channel layers 108, 112 (e.g., dielectric material is disposed between the material of the gates and the channel layers to provide a Schottky junction).

The first contact 120 may be coupled in direct electrical contact with the first channel layer 108, but not the second channel layer 112. The first contact 120 may be disposed in the one-channel regions underlying line 1C where the fin structures 105 only include the first channel layer 108. The second contact 116 may be coupled in direct electrical contact with the second channel layer 112, but not the first channel layer 108. The common contact 118 may be coupled in direct contact with both the second channel layer 112 and the first channel layer 108. The second contact 116 and the common contact 118 may be disposed in the two-channel regions underlying line 2C where the fin structures 105 include both the first channel layer 108 and the second channel layer 112. The bitline contact 126 may be coupled in direct electrical contact with the first channel layer 108, but not the second channel layer 112. The bitline contact 126 may be disposed in the one-channel regions underlying line 1C where the fin structures 105 only include the first channel layer 108, as can be seen.

Figure 4:
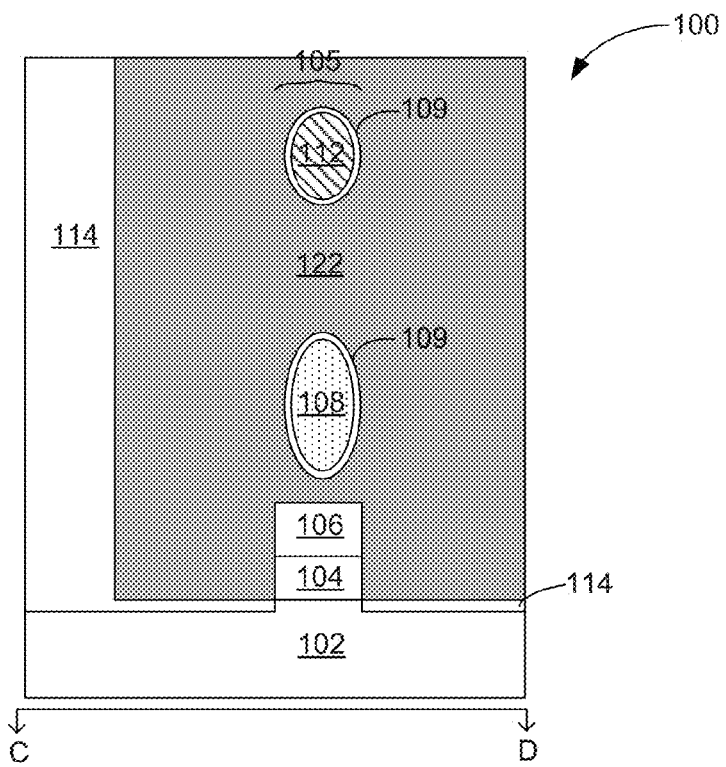
FIG. 4 schematically illustrates a cross-section side view across a fin structure of the IC device, in accordance with some embodiments.

The gate 122 may be electrically coupled (e.g., capacitively coupled) with the first channel layer 108 and the second channel layer 112. In some embodiments, the gate 122 may be configured to control current flow (e.g., arrows 150) in the second channel layer 112 between the second contact 116 and the common contact 118 for the second transistor 132. The gate 122 may be further configured to control current flow in the first channel layer 108 between the common contact 118 and the first contact 120 for the first transistor 130. The gate 122 may be disposed between the first contact 120 and the common contact 118 and between the second contact 116 and the common contact 118, as depicted. The gate 122 may be disposed in the two-channel region (e.g., region underlying line 2C where the fin structures 105 include both the first channel layer 108 and the second channel layer 112). Although not shown for the sake of clarity in FIG. 2, a gate dielectric material may be disposed between material of the gate 122 and material of the first and second channel layers 108, 112 to provide capacitive coupling between the gate 122 and the first and second channel layers 108, 112. An example gate dielectric film (e.g., gate dielectric film 109) is depicted in FIG. 4.

The wordline gate 124 may be electrically coupled (e.g., capacitively coupled) with the first channel layer 108, but not the second channel layer 112. The wordline gate 124 may be disposed in the one-channel regions underlying line 1C where the fin structures 105 only include the first channel layer 108, as can be seen. In some embodiments, the wordline gate 124 is disposed between the common contact 118 and the bitline contact 126. The wordline gate 124 may include a gate dielectric film (not shown in FIG. 3) disposed between material of the wordline gate 124 and material of the first channel layer 108 to provide capacitive coupling between the wordline gate 124 and the first channel layer 108.

Materials for the second contact 116, the common contact 118, the first contact 120, the bitline contact 126, the gate 122, and/or the wordline gate 124 may include any suitable electrically conductive material including, for example, metal. In some embodiments, the contacts 116, 118, 120, 126 and/or the gates 122, 124 (e.g., electrode materials) may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. In some embodiments, the contacts 116, 118, 120, 126 and/or the gates 122, 124 may include a metal nitride such as, for example, titanium nitride (TiN), tungsten nitride (WN), or tantalum nitride (TaN), or combinations thereof. In some embodiments, the contacts 116, 118, 120, 126 and/or the gates 122, 124 may include a metal silicide such as, for example, titanium silicide (TiSi), tungsten silicide (WSi), tantalum silicide (TaSi), cobalt silicide (CoSi), platinum silicide (PtSi), nickel silicide (NiSi), or combinations thereof. In some embodiments, the contacts 116, 118, 120, 126 and/or the gates 122, 124 may include a metal silicon nitride such as, for example, titanium silicon nitride (TiSiN), or tantalum silicon nitride (TaSiN), or combinations thereof. In some embodiments, the contacts 116, 118, 120, 126 and/or the gates 122, 124 may include a metal carbide such as, for example, titanium carbide (TiC), zirconium carbide (ZrC), tantalum carbide (TaC), hafnium carbide (HfC), or aluminum carbide (AlC), or combinations thereof. In some embodiments, the contacts 116, 118, 120, 126 and/or the gates 122, 124 may include a metal carbon nitride such as, for example, tantalum carbon nitride (TaCN), titanium carbon nitride (TiCN), or combinations thereof. In some embodiments, the contacts 116, 118, 120, 126 and/or the gates 122, 124 may include conductive metal oxides (e.g., ruthenium oxide). The materials may further include P-type workfuntion or N-type workfunction materials depending on whether the transistor is to be a P-type or N-type transistor. In some embodiments, multiple layers of different materials may be used to form the contacts 116, 118, 120, 126 and/or the gates 122, 124. The contacts 116, 118, 120, 126 and/or the gates 122, 124 may include other suitable materials in other embodiments.

In some embodiments, a pair of spacers (not shown) may bracket the gates 122, 124. The spacers may be formed from a material such as silicon nitride, silicon oxide, silicon carbide, silicon nitride doped with carbon, and silicon oxynitride. Processes for forming spacers are well known in the art and generally include deposition and etching process steps.

In some embodiments, the contacts 116, 118, 120, 126 may have a tapered profile shape with a wider dimension at the top and narrower dimension at the bottom, as can be seen. The wider dimension at the top of the contacts 116, 118, 120, 126 may reduce parasitic external resistance (Rext) of the IC device 100 and the narrower dimension at the bottom may facilitate scaling to smaller sizes in the transistor regions by providing more space for the transistors 130, 132, 134. The profile of the contacts 116, 118, 120, 126 may be achieved, for example, by a wet/dry etch patterning process that provides sloped sidewalls in a contact trench formed by the patterning process.

In some embodiments, the gates 122, 124 may have a more rectangular shaped profile relative to the contacts 116, 118, 120, 126. That is, in some embodiments, the contacts 116, 118, 120, 126 may have a profile that is more tapered relative to a profile of the gates 122, 124, as depicted. The profile of the gates 122, 124 may be more rectangular as a result of a patterning process that may be used to form the gates 122, 124. For example, a replacement metal gate (RMG) process may be used to form the gates 122, 124 such that a dummy gate is first formed using a sacrificial material that is subsequently removed and replaced with another gate material as described in greater detail herein in connection with FIG. 14.

In some embodiments, the gates 122, 124 may be formed in a first ILD layer 160 and the contacts 116, 118, 120, 126 may be formed in a second ILD layer 170. For example, the second ILD layer 170 of ILD material 114 may be deposited over the gates 122, 124 after formation of the gates 122, 124 and the contacts 116, 118, 120 may be formed in the second ILD layer 170 of the ILD material 114 such that a single continuous material structure of the contacts 116, 118, 120, 126 extends above a single continuous material structure of the gates 122, 124, as can be seen. Other configurations of the contacts 116, 118, 120, 126 relative to the gates 122, 124 may be used in other embodiments.

An electrically insulative material such as, for example, ILD material 114, may be deposited to electrically insulate the electrically conductive structures of the IC device 100 from one another. A plurality of ILD layers (e.g., first ILD layer 160 and second ILD layer 170) may be deposited over the transistors 130, 132, 134. The ILD layers may be formed using dielectric materials known for their applicability in integrated circuit structures, such as low-k dielectric materials. Examples of dielectric materials that may be used include, but are not limited to, silicon oxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or other voids to further reduce their dielectric constant. The ILD material 114 may include other suitable materials in other embodiments.

As can be seen in the cross-section side view of FIG. 3, portions of each of the second contact 116, the common contact 118, and the gate 122 may be disposed above and below the second channel layer 112 in some embodiments. Portions of the first contact 120, the common contact 118, the gate 122, the wordline gate 124, and the bitline contact 126 may be disposed above and below the first channel layer 108 in some embodiments.

According to various embodiments, the second contact 116 is configured to surround, in at least one planar dimension, material of the second channel layer 112. Material of the second contact 116 may wrap around the first channel layer 108 to completely surround the channel of the first transistor 130. Similarly, the first contact 120, the wordline gate 124 and the bitline contact 126 may be configured to surround, in at least one planar dimension, material of the first channel layer 108. The common contact 118 and the gate 122 may be configured to surround, in at least one planar dimension, material of the first channel layer 108 and material of the second channel layer 112. In some embodiments, the planar dimension may be perpendicular to a planar surface of the semiconductor substrate 102 upon which the IC device 100 is formed (e.g., a planar dimension in and out of the page at cross-section line CD of FIG. 2).

FIG. 4 schematically illustrates a cross-section side view across a fin structure (e.g., fin structures 105 of FIG. 2) of the IC device 100, in accordance with some embodiments. For example, the cross-section side view of FIG. 4 may represent a view along line CD of FIG. 2. FIG. 4 shows how material of the gate 122 may be positioned to surround material of the first channel layer 108 and the second channel layer 112 in the plane of the cross-section. Referring to FIGS. 3 and 4, it is noted that although FIG. 4 only depicts an example of the gate 122 surrounding the first and second channel layers 108, 112, the same or similar configurations as described herein for the gate 122 may be used for the second contact 116, the common contact 118, the first contact 120, the wordline gate 124, and the bitline contact 126 in connection with the first and/or second channel layers 108, 112. According to various embodiments, gates 122, 124, or contacts 116, 118, 120, 126 that are configured to completely surround the first and/or second channel layers 108, 112 may be respectively referred to as all around gates (AAGs) or all around contacts (AACs).

In some embodiments, a gate dielectric film 109 may be formed on the channel layers 108, 112 to provide capacitive coupling between the channel layers 108, 112 and the gates 122, 124. The gate dielectric film 109 may be conformally deposited on the material of the channel layers 108, 112. The gate dielectric film 109 may include a variety of suitable dielectric materials including high-k materials. In some embodiments, the gate dielectric film 109 may include, for example silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. In some embodiments, an annealing process may be carried out on the gate dielectric film 109 to improve its quality when a high-k material is used. Other materials may be used in other embodiments for the gate dielectric film 109.

The first and/or second channel layers 108, 112 may have rounded edges (e.g., rounded profile) in the cross-section side view of FIG. 4 owing to an etch process that may be used to remove material of the isolation layers 106, 110. In some embodiments, the etch process may selectively remove the materials of the isolation layers 106, 110 relative to the materials of the channel layers 108, 112. A more selective etch process may form a more rectangular-shaped profile and a less selective etch process may form a more rounded profile of the channel layers 108, 112.

In other embodiments, the gates 122, 124, or contacts 116, 118, 120, 126 may be configured to partially surround the first and/or second channel layers 108, 112 (e.g., as described in connection with FIG. 5).

Figure 5:
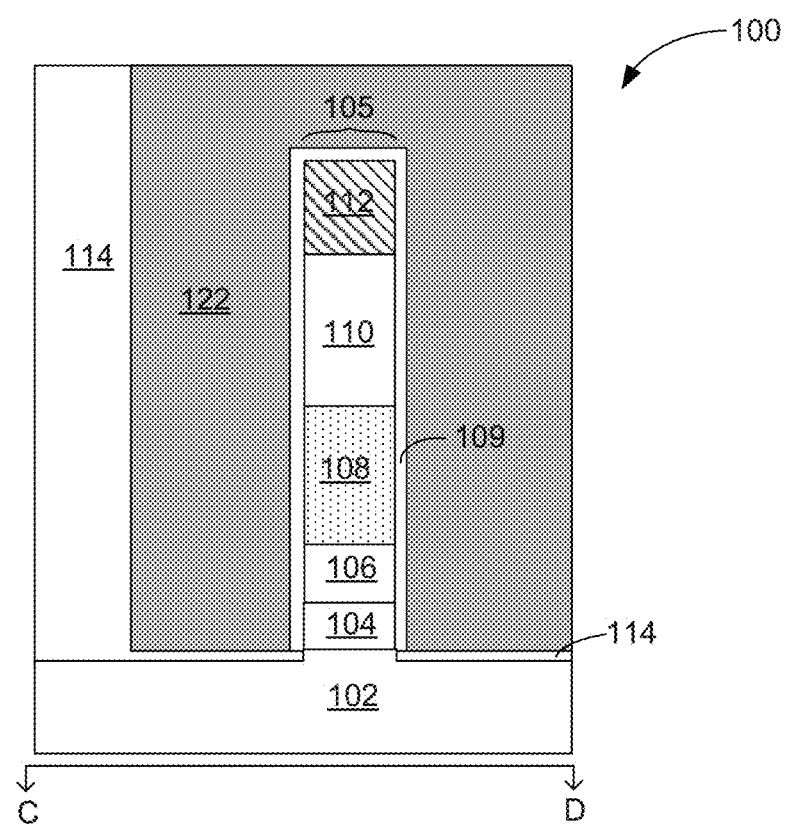
FIG. 5 schematically illustrates an cross-section side view across an alternative fin structure of the IC device, in accordance with some embodiments.

FIG. 5 schematically illustrates a cross-section side view across an alternative fin structure of the IC device 100, in accordance with some embodiments. Referring to FIGS. 3 and 5, in some embodiments, the gates 122, 124, or contacts 116, 118, 120, 126 may be configured to partially surround the first and/or second channel layers 108, 112, as can be seen. For example, in some embodiments, the isolation layers 106, 110 may not be selectively removed during formation of the gates 122, 124, or contacts 116, 118, 120, 126. A gate dielectric film 109 may be deposited such that the material of the gate dielectric film 109 is disposed between material of the channel layers 108, 112 and material of the gates 122, 124, or contacts 116, 118, 120, 126.

The first and/or second channel layers 108, 112 may have more rectangular edges in the cross-section side view of FIG. 5 than the edges of the first and/or second channel layers 108, 112 of FIG. 4 because in FIG. 5, an etch process may not be used to remove material of the isolation layers 106, 110 during formation of the gates 122, 124, or contacts 116, 118, 120, 126.

According to various embodiments, the gate 122 may be arranged in a tri-gate configuration around the second channel layer 112 and a dual-gate configuration around the first channel layer 108, as can be seen. The tri-gate configuration includes material of the gate 122 coupled to three surfaces of the channel that are each configured about 90 degrees relative to an adjacent surface of the three surfaces where two of the surfaces are substantially parallel. Due to etching or other manufacturing processes the three surfaces of the tri-gate configuration may have rounded edges where they coincide. The gate 122 may be arranged in a dual-gate configuration around the first channel layer 108, as can be seen. The dual-gate configuration includes material of the gate 122 coupled to two surfaces of the channel that are substantially parallel with one another. The two surfaces may not be exactly parallel in some cases owing to etch processes that may provide sloped sidewalls of the fin structures 105. For example, in some embodiments, a top region (e.g., distal portion) of the fin structures 105 may have a narrower dimension (e.g, width) than a bottom region (e.g., adjacent portion) of the fin structures 105, the bottom region being closer to the semiconductor substrate 102 than the top region. Accordingly, a width of the second channel layer 112 in the fin structures 105 may be narrower than a width of the first channel layer 108 in the fin structures 105, in some embodiments. The width of the fin structures 105 may be a dimension extending in a direction (e.g., direction along line CD) that is perpendicular to an elongate direction (e.g., direction along line AB of FIG. 3) of the fin structures 105.

The wordline gate 124 and/or contacts 116, 118, 120, 126 may include analogous tri-gate or dual-gate configurations based on the principles described in connection with the gate 122. A tri-contact or dual-contact configuration may provide a similar configuration as a respective tri-gate or dual-gate contact, but for a contact instead of a gate. For example, in some embodiments, the wordline gate 124 may form a tri-gate configuration with the first channel layer 108. The first contact 120 may form a tri-contact configuration with the first channel layer 108. The second contact 116 may form a tri-contact configuration with the second channel layer 112. The common contact 118 may form a tri-contact configuration with the second channel layer 112 and a dual-contact configuration with the first channel layer 108. The bitline contact 126 may form a tri-contact configuration with the first channel layer 108. Other gate or contact configurations may be used in other embodiments.

According to various embodiments, the transistors 130, 132, 134 of FIG. 3 include nonplanar transistors such as dual- or double-gate transistors, tri-gate transistors, and AAG or wrap-around gate transistors, some of which are often referred to as FinFET transistors. In other embodiments, suitable planar transistors may be used.

Figure 6:
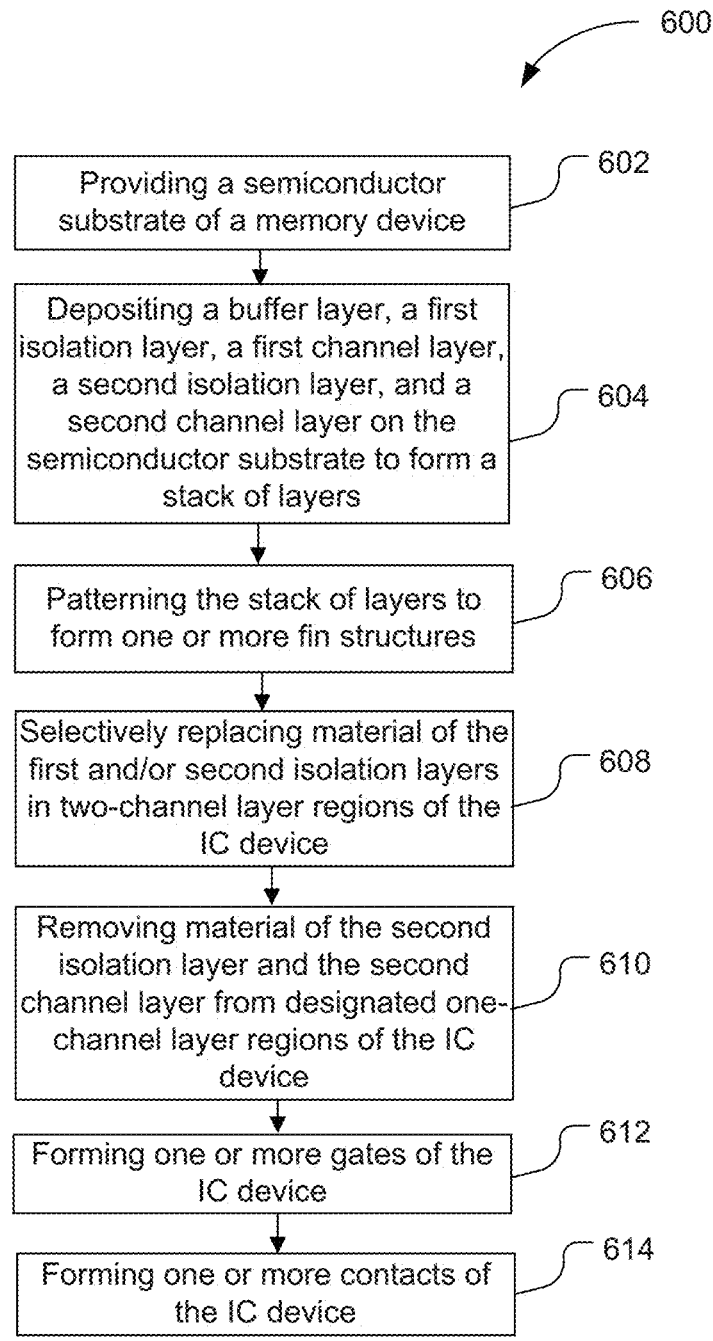
FIG. 6 is a flow diagram for a method of fabricating a stacked transistor configuration of an IC device, in accordance with some embodiments.
Figure 7:
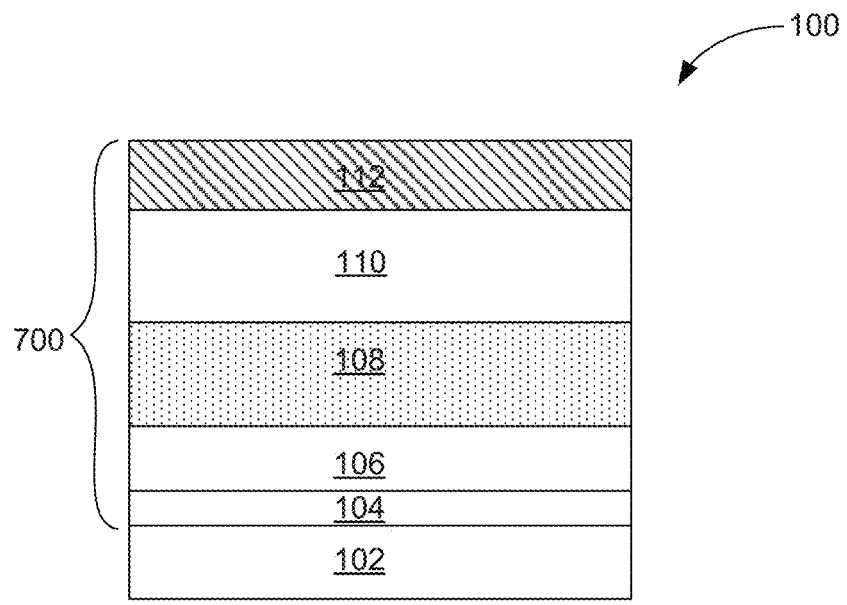
FIGS. 7-15 schematically illustrate an IC device 100 after various fabrication operations.

FIG. 6 is a flow diagram for a method 600 of fabricating a stacked transistor configuration of an IC device (e.g., the IC device 100 of FIGS. 1-5), in accordance with some embodiments. The method 600 may comport with techniques and/or configurations described in connection with FIGS. 1-5. FIGS. 7-15 schematically illustrate an IC device 100 after various fabrication operations described in connection with method 600 of FIG. 6. In FIG. 7, an IC device 100 is depicted subsequent to actions at 602 and 604 of method 600. Referring to FIGS. 6-7, at 602, the method 600 includes providing a semiconductor substrate 102 of an IC device 100. In some embodiments, a wafer may be provided for fabrication of integrated circuit devices (e.g., the integrated circuit device 100 of FIGS. 1-5).

At 604, the method 600 may further include depositing a buffer layer 104, a first isolation layer 106, a first channel layer 108, a second isolation layer 110, and a second channel layer 112 on the semiconductor substrate 102 to form a stack of layers 700. In some embodiments, a buffer layer 104 may be deposited on the semiconductor substrate 102. The first isolation layer 106 may be deposited on the buffer layer 104 or on the semiconductor substrate 102 if the buffer layer 104 is not used. The first channel layer 108 may be deposited on the first isolation layer 106. The second isolation layer 110 may be deposited on the first channel layer 108. The second channel layer 112 may be deposited on the second isolation layer 110. In some embodiments, the deposition of the layers at 604 may be performed by an epitaxial deposition process to provide a stack of layers 700 where each layer is epitaxially coupled together. In some embodiments, the layers deposited at 604 are deposited to cover a surface of a semiconductor wafer (e.g., wafer 10 of FIG. 1) in a single chamber of equipment that performs epitaxial deposition.

Figure 8:
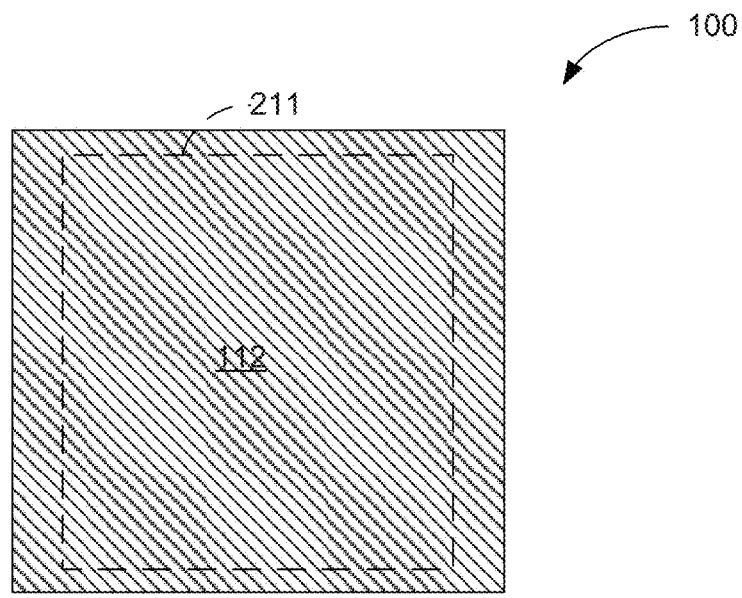

In FIG. 8, a top view of the IC device 100 of FIG. 7 is shown. Subsequent to the depositing of layers at 604, material of a second channel layer 112 and material of the underlying layers may cover an entire area of each unit cell layout 211 of the IC device 100.

Figure 9:
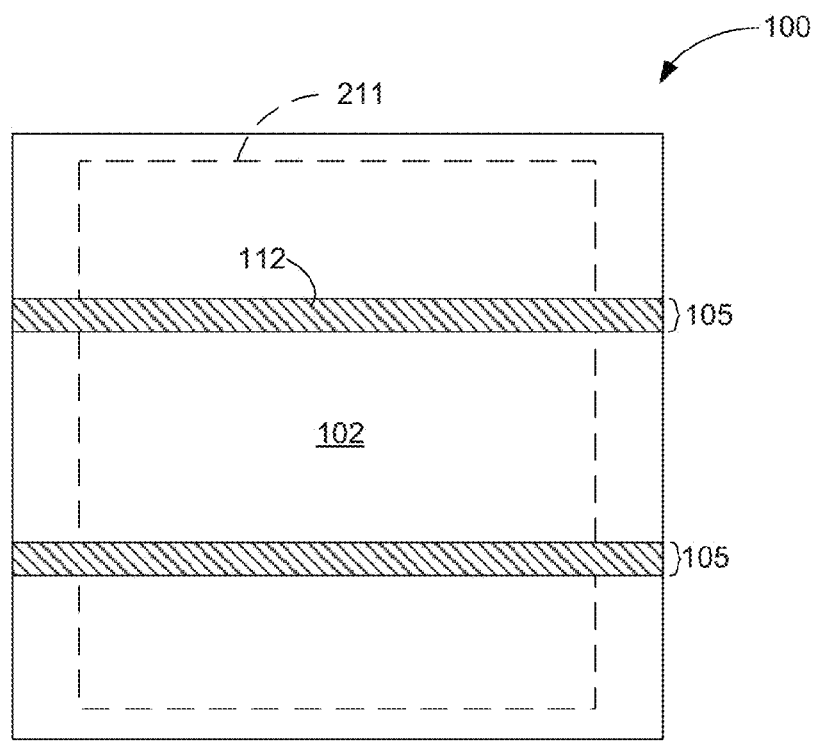
Figure 10:
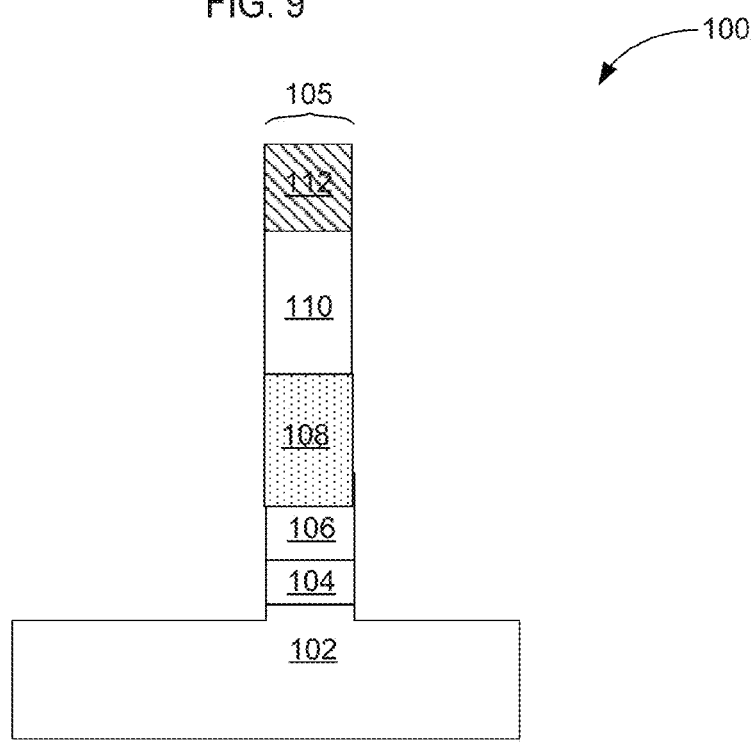

In FIGS. 9-10, an IC device 100 is shown subsequent to actions at 606 of method 600. FIG. 9 shows a top view of an IC device 100 from a similar perspective as FIG. 7. FIG. 10 shows a cross-section side view of an IC device 100 from a similar perspective as FIG. 5. Referring to FIGS. 6-7 and 9-10, at 606, the method 600 may further include patterning the stack of layers 700 to form one or more fin structures 105. The fin structures 105 may be patterned using, for example, lithography and/or etch processes. In some embodiments, a hardmask (e.g., silicon nitride) may be deposited over the stack of layers 700 and patterned with a design of the fin structures 105. An etch process may remove material of the stack of layers 700 underlying the hardmask pattern such that the fin structures 105 are formed. In some embodiments, the etch process removes all material of the stack of layers 700 except the material of the stack of layers 700 of the fin structures 105. The etch process may further remove a portion of the semiconductor substrate 102. For example, in some embodiments, the etch process to form the fin structures 105 may remove material of the semiconductor substrate 102 to a depth of 1 to 10,000 Angstroms into the semiconductor substrate 102.

Figure 11:
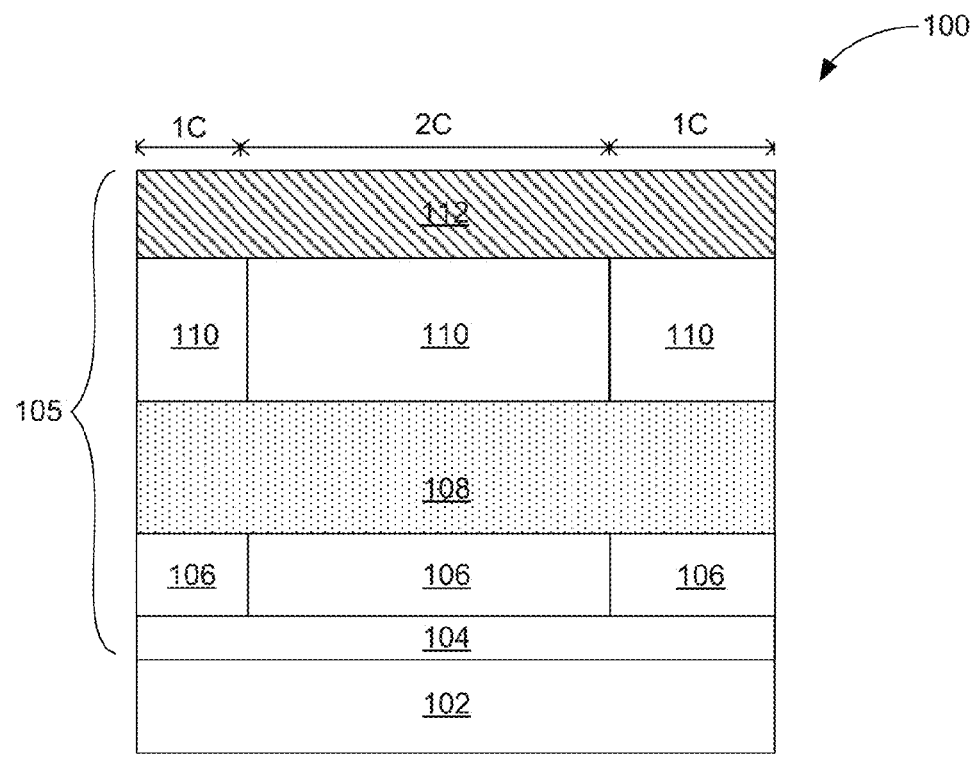

In FIG. 11, an IC device 100 is shown subsequent to actions at 608 of method 600. FIG. 11 shows a cross-section side view of an IC device 100 from a similar perspective as FIG. 3. Referring to FIGS. 6 and 11, at 608, the method 600 may further include selectively replacing material of the first and/or second isolation layers 106, 110 in designated two-channel regions (e.g., portion underlying line 2C) of the fin structures 105. The designated two-channel regions may be portions of fin structures 105 that have at least two stacked channel layers in a final product of the IC device 100. The material of the first and/or second isolation layers 106, 110 may be selectively replaced by a patterning process. In some embodiments, a photoresist or hardmask material is deposited and patterned to mask or otherwise protect the material of the first and/or second isolation layers 106, 110 in designated one-channel regions (e.g., portion underlying lines 1C) from an etch process that selectively removes the material of the first and/or second isolation layers 106, 110 in the designated two-channel regions of the IC device 100. The designated one-channel regions may be portions of the fin structure 105 having one channel layer in a final product of the IC device 100.

In the designated two-channel regions, a selective etch process may be used to selectively remove the material of the first and/or second isolation layers 106, 110 without significantly or substantially removing material of the first and/or second channel layers 108, 112. In some embodiments, the material that is selectively replaced at 608 is a lattice-matched semiconductor material (e.g., AlAs) that is epitaxially deposited to form the stack of layers (e.g., stack of layers 700 of FIG. 7). A replacement material for the first and/or second isolation layers 106, 110 may include, for example, a material (e.g., $SiO_2$) with increased electrical isolation properties or increased etch selectivity relative to the removed material. In some embodiments, the removed material of the first and/or second isolation layers 106, 110 may be replaced by depositing an isolation material such as, for example, interlayer dielectric (ILD) material 114. In some embodiments, the actions at 608 may be performed prior to actions at 610 of method 600.

Figure 12:
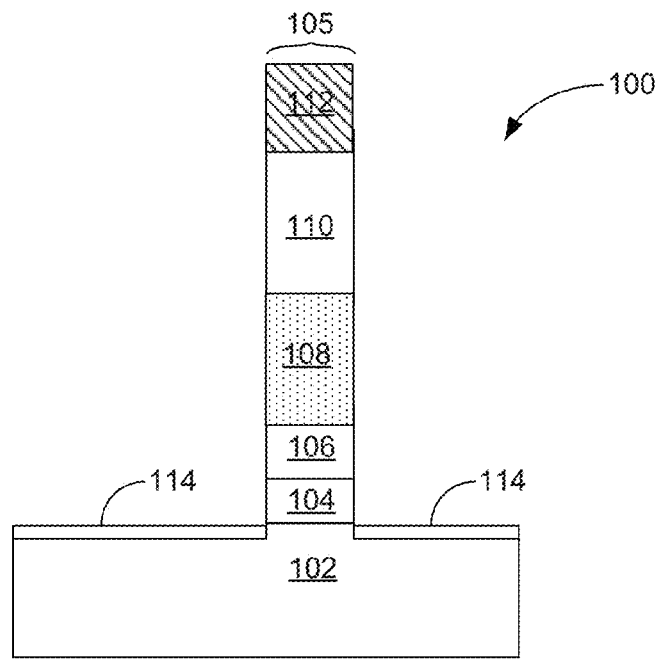

In FIG. 12, an IC device 100 is shown subsequent to depositing ILD material 114 to replace material of the first and/or second isolation layers 106, 110 in the designated two-channel regions (e.g., underlying line 2C of FIG. 11) of the IC device 100. FIG. 12 shows a cross-section view of the IC device 100 from a similar perspective as FIG. 10. In some embodiments, material of the first and/or second isolation layers 106, 110 may include a same ILD dielectric material 114 used to fill trench isolation regions on the semiconductor substrate 102, as can be seen. The deposited ILD material 114 may be polished to provide a substantially planar surface with the semiconductor substrate 102, as can be seen. The ILD material 114 may be deposited by spin-on techniques, conformal deposition techniques, atomic layer deposition (ALD), or any other suitable process. In other embodiments, the actions at 608 may not performed at all in the fabrication of the IC device 100.

Figure 13:
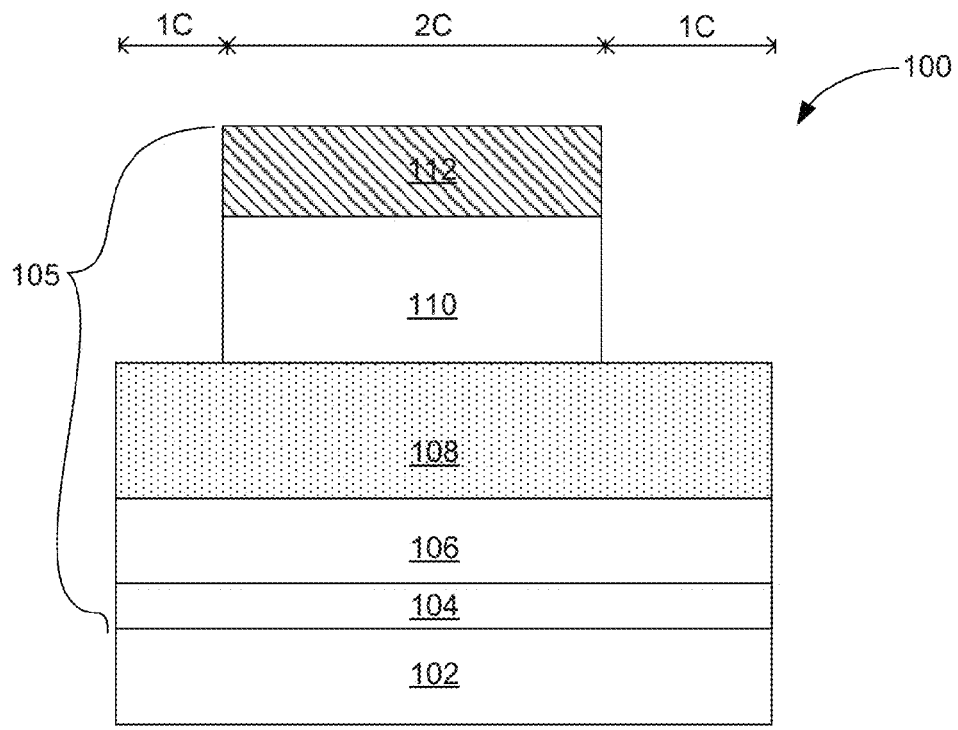

In FIG. 13, an IC device 100 is shown subsequent to actions at 610 of method 600. FIG. 13 shows a cross-section side view of an IC device 100 from a similar perspective as FIG. 11. Referring to FIGS. 6 and 13, at 610, the method 600 may further include removing material of the second isolation layer 110 and the second channel layer 112 from designated one-channel regions (e.g., underlying lines 1C) of the IC device 100. In some embodiments, removing the material of the second isolation layer 110 and the second channel layer 112 forms the one-channel regions and the two-channel regions. The material of the second isolation layer 110 and the second channel layer 112 may be removed by a patterning process. In some embodiments, a photoresist or hardmask material is deposited and patterned to mask or otherwise protect the material of the fin structures 105 in two-channel regions (e.g., portions underlying lines 2C) from an etch process that removes the material of the of the second isolation layer 110 and the second channel layer 112 in the one-channel regions of the IC device 100.

Figure 14:
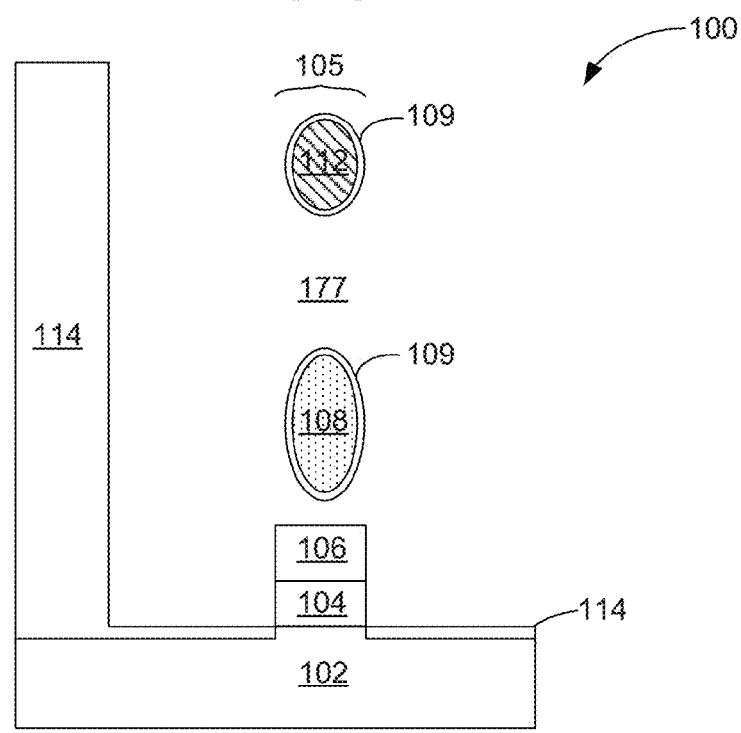

In FIG. 14, an IC device 100 is shown subsequent to actions at 612 of method 600. For example, the IC device 100 in FIG. 14 may represent an IC device subsequent to etching processes that form a gate trench 177 corresponding to a location where a gate (e.g., gate 122 of FIG. 3) is formed, but prior to deposition of an electrically conductive material to fill the gate trench 177. FIG. 14 shows a cross-section side view of an IC device 100 from a similar perspective as FIG. 12. Referring to FIGS. 6 and 14, at 612, the method 600 may further include forming one or more gate(s) (e.g., gates 122, 124 of FIG. 3) of the IC device 100.

The gate(s) may be formed using a patterning process such as a replacement metal gate (RMG) process. For example, a dummy gate material (e.g., sacrificial material) such as polysilicon may be conformally deposited to cover the fin structures 105 and regions between the fin structures 105. The dummy gate material may be patterned to form one or more dummy gate(s). An electrically insulative material such as, for example, ILD material 114 (e.g., first ILD layer 160 of FIG. 3) may be deposited to fill regions between individual fin structures of the fin structures 105. The ILD material 114 may be polished to be planar with a top of the dummy gate(s). In this regard, the gates 122, 124 may be disposed in the deposited ILD material 114 (e.g., the first ILD layer 160 of FIG. 3). An etch process may be used to selectively remove the material of the dummy gate(s) to expose portions of the fin structures 105 where the gate(s) are to be formed.

In some embodiments, a gate dielectric film 109 may be deposited on the exposed portions of the fin structures 105 (e.g., at least the first and/or second channel layers 108, 112) and gate material may be deposited on the gate dielectric film 109 to form a gate 122 having tri-gate and/or dual-gate configurations as depicted in FIG. 5. In other embodiments, the exposed portions of the fin structures 105 may undergo a selective etch process that substantially removes material of the first and/or second isolation layers 106, 110, without significantly removing material of the first and/or second channel layers 108, 112, as depicted in FIG. 14. FIG. 14 depicts the IC device 100 subsequent to the selective etch process such that the gate trench 177 (e.g., an airgap) surrounds the first and second channel layers 108, 112 where the gate (e.g., gate 122 of FIG. 4) is to be formed. A gate dielectric film 109 may be deposited on the exposed surfaces of the first and/or second channel layers 108, 112 followed by deposition of the gate material on the gate dielectric film 109 to form a gate 122 having an AAG configuration as depicted in FIG. 4. The gate materials may be deposited by atomic layer deposition (ALD) or any other suitable deposition process. Subsequent to depositing the gate materials to form the gate(s), the IC device 100 may be polished to provide a planar surface at the top of the gate(s) with the ILD material 114.

In some embodiments, the gates 122, 124 of FIG. 3 are simultaneously formed. In other embodiments, the gates 122, 124 of FIG. 3 may be separately formed. Other suitable techniques may be used to form the gate(s) in other embodiments.

Figure 15:
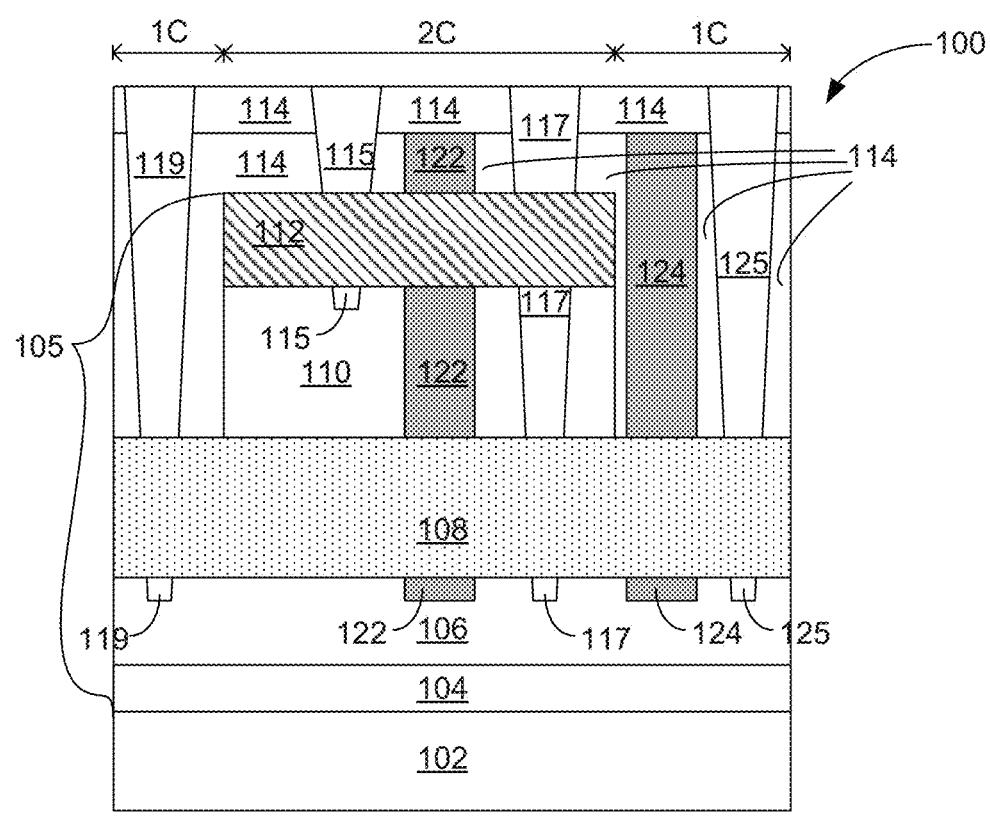

In FIG. 15, an IC device 100 is shown subsequent to actions at 614 of method 600. For example, the IC device 100 in FIG. 15 may represent the IC device 100 subsequent to patterning actions that form the contact trenches 119, 115, 117, 125 of respective contacts 120, 116, 118, 126 of FIG. 3 and prior to filling the contact trenches 119, 115, 117, 125 with electrically conductive material. FIG. 15 shows a cross-section side view of an IC device 100 from a similar perspective as FIG. 11. Referring to FIGS. 6 and 15, the method 600 may further include forming one or more contacts (e.g., contacts 120, 116, 118, 126 of FIG. 3) of the IC device 100.

The one or more contacts may be formed in an electrically insulative layer formed over the gates 122, 124. For example, ILD material 114 may be deposited to form a layer (e.g., second ILD layer 170 of FIG. 3) over the gates 122 and previously deposited ILD material 114 (eg., first ILD layer 160 of FIG. 3). The ILD material 114 disposed on the gates 122, 124 may be polished to have a planar surface and then patterned to allow removal of material (e.g., by etching) in the regions where the contacts are to be formed. In this regard, the contacts may be formed in the second ILD layer 170 of FIG. 3. The ILD material 114 and/or the material of the isolation layers 106, 110 may be removed by etching processes that form the contact trenches 119, 115, 117, 125. In embodiments where the material of the isolation layers 106, 110 and the ILD material 114 are the same, a single etch process may be used. In some embodiments, the contact trenches 119, 115, 117, 125 are formed using a patterning process that does not utilize a sacrificial material. Thus, the contacts may have a more tapered profile relative to the profile of the gates in some embodiments.

In some embodiments, the channel regions of the first and/or second channel layers 108, 112 may be doped where the contacts are to be formed (e.g., the exposed channel layers 108, 112 in the contact trenches 119, 115, 117, 125). For example, the channel regions for N-type devices may be doped with N-type dopants and the channel regions for P-type devices may be doped with P-type dopants. In some embodiments, for an N-type channel region, the channel regions of the channel layers 108, 112 may be doped with silicon (Si), sulfur (S), tellurium (Te), or combinations thereof. For a P-type channel region, the channel regions of the channel layers 108, 112 may be doped with beryllium (Be), carbon (C), or combinations thereof. In one embodiment, the channel region of the first channel layer 108 may be doped with a deep channel implant including N-type dopants. Subsequent to the deep channel implant, the channel region of the second channel layer 112 may be doped with a shallow implant including P-type dopants. Other impurities or techniques may be used to dope the channel regions of the channel layers 108, 112 in other embodiments.

An electrically conductive material may be deposited to substantially fill the contact trenches 119, 115, 117, 125. In some embodiments, the electrically conductive material is deposited by atomic layer deposition (ALD). The electrically conductive material may be deposited to form the contacts using other deposition techniques in other embodiments.

Each of the contacts may be independently formed using a separate patterning process in some embodiments owing to potentially different materials to be etched and/or depths and, thus, potentially different etch chemistries and/or etch times. In some embodiments, the contacts corresponding with contact trenches 119, 125 may be simultaneously formed owing to the potentially similar depths and/or materials of the contact trenches 119, 125. The contact trenches 115 and 117 may each be separately formed using respective patterning processes. In some embodiments, separate masking operations are used to form the contact trench 119 and the contact trench 115. In other embodiments, the contact trenches 115, 117, 119, 125 may be simultaneously formed using a same patterning process.

Figure 16:
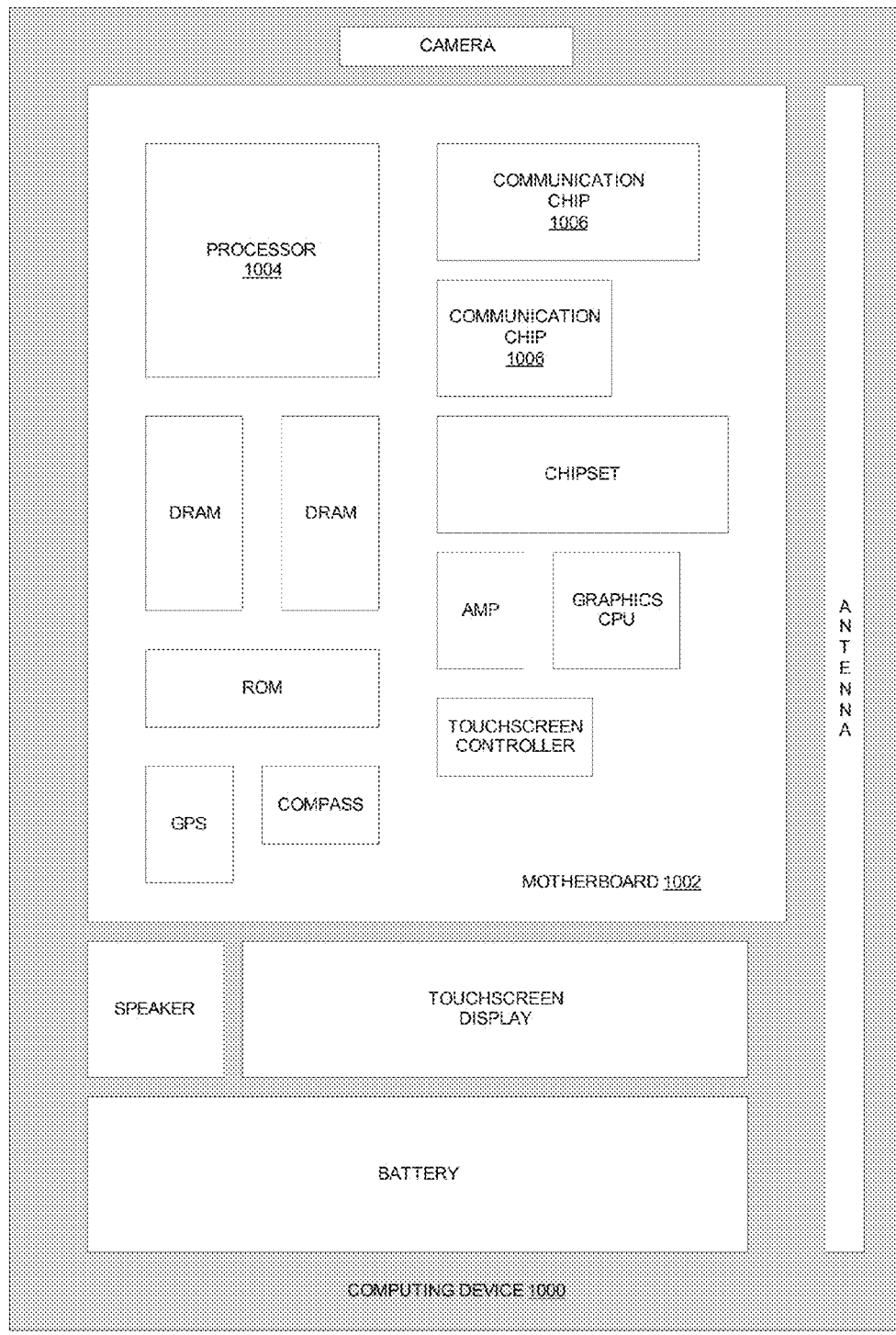
FIG. 16 schematically illustrates a computing device in accordance with one implementation of the invention.

Embodiments of the present disclosure may be implemented into a system using any suitable hardware and/or software to configure as desired. FIG. 16 schematically illustrates a computing device 1000 in accordance with one implementation of the invention. The computing device 1000 houses a board such as motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002. In further implementations, the communication chip 1006 is part of the processor 1004.

Depending on its applications, computing device 1000 may include other components that may or may not be physically and electrically coupled to the motherboard 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die (e.g., dies 101 of FIG. 1) of the processor 1004 includes one or more devices (e.g., IC device 100 of FIGS. 1-5), including transistors (e.g., transistors 130, 132, 134 of FIG. 3) as described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices (e.g., IC device 100 of FIGS. 1-5), including transistors (e.g., transistors 130, 132, 134 of FIG. 3) as described herein.

In further implementations, another component (e.g., memory device or other integrated circuit device) housed within the computing device 1000 may contain an integrated circuit die that includes one or more devices (e.g., IC device 100 of FIGS. 1-5), including transistors (e.g., transistors 130, 132, 134 of FIG. 3) as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method, comprising:
providing a semiconductor substrate;
depositing a first isolation layer on the semiconductor substrate, a first channel layer on the first isolation layer, a second isolation layer on the first channel layer, and a second channel layer on the second isolation layer to form a stack of layers;
patterning the stack of layers to form one or more fin structures, the one or more fin structures including the first isolation layer, the first channel layer, the second isolation layer, and the second channel layer; and
removing a portion of the second isolation layer and a portion of the second channel layer within an individual fin structure of the one or more fin structures to form a one-channel region of the individual fin structure, wherein the stack of layers within the one-channel region of the individual fin structure only includes the first channel layer and the first isolation layer and the stack of layers within a two-channel region of the individual fin structure includes both the first channel layer and the second channel layer.

2. The method of claim 1, wherein depositing the first isolation layer on the semiconductor substrate, the first channel layer on the first isolation layer, the second isolation layer on the first channel layer, and the second channel layer on the second isolation layer is performed by molecular beam epitaxy (MBE), atomic layer epitaxy (ALE), epitaxial growth, chemical beam epitaxy (CBE), metal-organic chemical vapor deposition (MOCVD), or combinations thereof.

3. The method of claim 1, wherein patterning the stack of layers and removing the portion of the second isolation layer is performed using a patterning process including lithography and etch processes.

4. The method of claim 1, further comprising:
forming a gate terminal, the gate terminal being capacitively coupled with the first channel layer to control flow of electrical current through the first channel layer for a first transistor and being capacitively coupled with the second channel layer to control flow of electrical current through the second channel layer for a second transistor, the gate terminal being disposed between a first contact and a common contact to control the flow of electrical current between the first contact and the common contact for the first transistor and the gate terminal being disposed between a second contact and the common contact to control the flow of electrical current between the second contact and the common contact for the second transistor.

5. The method of claim 4, wherein forming the gate terminal comprises:
selectively removing a second portion of the second isolation layer in the two-channel region, the second portion of the second isolation layer being located between the first channel layer and the second channel layer; and
depositing an electrically conductive material to fill an area between the first channel layer and the second channel layer, the area being where the second portion of the second isolation layer was selectively removed.

6. The method of claim 5, wherein the electrically conductive material is deposited by atomic layer deposition (ALD).

7. The method of claim 4, further comprising:
forming the first contact, the second contact, and the common contact, wherein the first contact is electrically coupled with the first channel layer in the one-channel region, the second contact is electrically coupled with the second channel layer in the two-channel region, and the common contact is electrically coupled with the first channel layer and the second channel layer in the two-channel region.

8. The method of claim 7, wherein forming the first contact, the second contact, and the common contact is performed using three independent patterning processes that correspond to formation of each of the first contact, the second contact, and the common contact.

9. The method of claim 7, further comprising:
depositing a first layer of interlayer dielectric (ILD) material, wherein the gate terminal is disposed in the first layer of ILD material; and
depositing a second layer of ILD material on the first layer of ILD material, wherein the first contact, the second contact, and the common contact are formed in the second layer of ILD material.

10. The method of claim 7, wherein forming the gate terminal comprises a replacement metal gate process that utilizes a sacrificial gate material; and
wherein forming the first contact, the second contact, and the common contact comprises a patterning process that does not use a sacrificial contact material, wherein the first contact, the second contact, and the common contact have a profile that is more tapered relative to a profile of the gate terminal.

11. The method of claim 4, further comprising:
selectively replacing material from the deposited first isolation layer and the deposited second isolation layer with a different material in the two-channel region prior to removing the portion of the second isolation layer and the portion of the second channel layer.

12. The method of claim 11, wherein:
the material from the deposited first isolation layer and the deposited second isolation layer comprises a group III-V semiconductor material; and
the different material comprises silicon oxide (SiO2).

13. The method of claim of claim 1, further comprising:
depositing a buffer film on the semiconductor substrate, the buffer film being disposed between the semiconductor substrate and the first isolation layer.

14. The method of claim 1, wherein providing the semiconductor substrate comprises providing a wafer.

15. The method of claim 1, wherein the one-channel region is a first one-channel region, wherein removing the portion of the second isolation layer and the portion of the second channel layer is further to form a second one-channel region of the individual fin structure, wherein the stack of layers within the second one-channel region of the individual fin structure only includes the first channel layer and the first isolation layer, and wherein the first one-channel region and the second one-channel region are located on opposing sides of the two-channel region.

* * * * *